(12) United States Patent
Dikshit et al.

(10) Patent No.: US 12,099,790 B1
(45) Date of Patent: Sep. 24, 2024

(54) HIGH-SPEED COMMUNICATION BETWEEN INTEGRATED CIRCUITS OF AN EMULATION SYSTEM

(71) Applicant: Xilinx, Inc., San Jose, CA (US)

(72) Inventors: Raghukul B. Dikshit, San Jose, CA (US); Tauheed Ashraf, Saratoga, CA (US); Michael Chyziak, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 842 days.

(21) Appl. No.: 17/204,431

(22) Filed: Mar. 17, 2021

(51) Int. Cl.
*G06F 30/331* (2020.01)
*H04J 3/06* (2006.01)

(52) U.S. Cl.
CPC ............. *G06F 30/331* (2020.01); *H04J 3/06* (2013.01)

(58) Field of Classification Search
None
See application file for complete search history.

(56) References Cited

U.S. PATENT DOCUMENTS

| | | | | |
|---|---|---|---|---|
| 9,330,220 | B1 * | 5/2016 | Dehkordi | G06F 30/392 |
| 9,846,587 | B1 * | 12/2017 | Schumacher | G06F 9/455 |
| 10,796,048 | B1 * | 10/2020 | Azuelos | G06F 30/30 |
| 2004/0037313 | A1 | 2/2004 | Gulati et al. | |
| 2013/0250792 | A1 | 9/2013 | Yoshida et al. | |
| 2016/0182391 | A1 | 6/2016 | Theobald et al. | |
| 2017/0220508 | A1 | 8/2017 | Kaviani et al. | |
| 2017/0364621 | A1 * | 12/2017 | Lepercq | G06F 30/367 |
| 2018/0102863 | A1 | 4/2018 | Royle | |
| 2018/0285125 | A1 | 10/2018 | Chhabbi et al. | |
| 2019/0050361 | A1 | 2/2019 | Raghava et al. | |
| 2019/0179989 | A1 * | 6/2019 | Emirian | G06F 30/331 |
| 2019/0227963 | A1 | 7/2019 | Ooi et al. | |
| 2019/0349095 | A1 | 11/2019 | Briseno-Vidrios et al. | |

OTHER PUBLICATIONS https://www.synopsys.com/verification/emulation.html, Emulation, 6 pages.
https://www.electronicdesign.com/technologies/test-measurement/article/21800385/hardware-emulation-a-weapon-of-mass-verification, Hardware Emulation: A Weapon of Mass Verification, Lauro Rizzatti, 12 pages.

* cited by examiner

*Primary Examiner* — Srinivasa R Reddivalam
(74) *Attorney, Agent, or Firm* — Kevin T. Cuenot

(57) ABSTRACT

An emulation system can include a first integrated circuit (IC) including first circuitry and a first transceiver. The first circuitry is configured to emulate a first partition of a circuit design. The first circuitry is clocked by an emulation clock and the first transceiver is clocked by a transceiver clock asynchronous with the emulation clock. The transceiver clock has a higher frequency than the emulation clock. The emulation system can include a second IC configured to emulate a second partition of the circuit design. The second IC includes a second transceiver. The first transceiver is configured to generate multiplexed emulation data by multiplexing a plurality of nets that cross from the first partition to the second partition of the circuit design. The first transceiver is configured to send the multiplexed emulation data over a serial communication channel to the second transceiver. The multiplexed emulation data includes a clock signal of the first transceiver embedded therein.

20 Claims, 12 Drawing Sheets

700

| SOF | Data | EOF | CRC |
|-----|------|-----|-----|
|     |      |     | CRC |

| SOF | Data | EOF | CRC |

| SOF | Data | EOF | Parity |

FIG. 9

HIGH-SPEED COMMUNICATION BETWEEN INTEGRATED CIRCUITS OF AN EMULATION SYSTEM

TECHNICAL FIELD

This disclosure relates to integrated circuits (ICs) and, more particularly, to emulation systems that utilize multiple ICs to emulate large circuit designs.

BACKGROUND

Some emulation systems use multiple integrated circuits (ICs) to provide in-circuit emulation of circuit designs. Often, the ICs are programmable ICs such as Field Programmable Gate Arrays or "FPGAs." For such an emulation system, silicon components of the circuit design to be emulated are synthesized and mapped to equivalent hardware resources on the programmable ICs of the emulation system. In most cases, since the circuit design does not fit within a single programmable IC, the circuit design is ported over and partitioned for implementation across the multiple programmable ICs of the emulation system. In a typical circuit design for a System-on-Chip, for example, the number of nets that cross between programmable ICs of the emulator system post-partitioning may be upwards of 5-25 thousand.

Typically, each programmable IC of the emulation system shares inputs/outputs (I/Os) with multiple other programmable ICs. The programmable ICs of the emulation system typically connect via Select I/Os in a mesh architecture. There are fewer available Select I/Os than partitioned or cut nets that must cross programmable IC boundaries in the emulation system. To accommodate the number of nets that must cross between programmable ICs to emulate the circuit design, the data from the nets is time division multiplexed before being transmitted from one programmable IC to another. This process is referred to as "pin-multiplexing" or "pin-muxing." The speed of the emulation clock, in reference to the clock used to clock the circuitry being emulated in the programmable IC, is slowed down to match the multiplexing ratio. In general, the higher the multiplexing ratio, the lower the frequency of the emulation clock.

Available emulation systems utilize Select I/O to transmit cycle accurate data between programmable ICs. Select I/O is limited in its ability to scale with size and transistor counts of circuit designs. One consequence is that Select I/O imposes a bottleneck on emulation performance where increased multiplexing ratios lead to lower emulation clock frequencies. The I/O limitations of programmable ICs also adversely impact performance of the implementation tools as the amount of time needed to achieve a viable partitioning and implementation of the circuit design across the emulation system programmable ICs may be significant. Ever increasing circuit design size will likely exacerbate these inefficiencies.

SUMMARY

An emulation system can include a first integrated circuit (IC) including first circuitry and a first transceiver. The first circuitry is configured to emulate a first partition of a circuit design. The first circuitry is clocked by an emulation clock and the first transceiver is clocked by a transceiver clock asynchronous with the emulation clock. The transceiver clock has a higher frequency than the emulation clock. The emulation system can include a second IC configured to emulate a second partition of the circuit design. The second IC includes a second transceiver. The first transceiver is configured to generate multiplexed emulation data by multiplexing a plurality of nets that cross from the first partition to the second partition of the circuit design. The first transceiver is configured to send the multiplexed emulation data over a serial communication channel to the second transceiver. The multiplexed emulation data includes a clock signal of the first transceiver embedded therein.

An IC can include first circuitry configured to emulate a partition of a circuit design. The first circuitry is clocked by an emulation clock. The IC includes a transceiver coupled to the first circuitry. The transceiver is clocked by a transceiver clock that is asynchronous with the emulation clock and that has a higher frequency than the emulation clock. The transceiver can include an edge detector circuit configured to detect edges of the emulation clock and a framing circuit configured to generate multiplexed emulation data by multiplexing a plurality of nets of the first circuitry. The framing circuit further generates packets of the multiplexed emulation data. The framing circuit is operative responsive to the edge detector circuit. The transceiver can include a scrambler circuit configured to scramble the packets from the framing circuit. The transceiver also can include a physical layer circuit (PHY) configured to send the scrambled packets over a serial communication channel. The scrambled packets include a clock signal of the transceiver embedded therein.

A method can include determining a cut of a net of a circuit design, wherein the net is cut as part of a partitioning process to emulate the circuit design using an emulation system. The method can include assigning the net to a slot selected from a plurality of slots of a transceiver in an integrated circuit of the emulation system. The selected slot is selected based on a location of the cut along the net. The method can include assigning a first timing constraint to a first portion of the net corresponding to a driver of the net to the cut and assigning a second timing constraint to a second portion of the net corresponding to the cut to a load of the net. The first and second timing constraints depend on the slot. The method also can include implementing partitions of the circuit design including the net using the first and second timing constraints.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 7 illustrates an example packet that may be generated by the framing circuit.

FIG. 8 illustrates another example packet that may be generated by the framing circuit.

FIG. 9 illustrates another example packet that may be generated by the framing circuit.

DETAILED DESCRIPTION

This disclosure relates to integrated circuits (ICs) and, more particularly, to emulation systems that utilize multiple ICs to emulate large circuit designs including circuit designs for ICs and/or System-on-Chips (SoCs). In accordance with the inventive arrangements described within this disclosure, a circuit architecture is provided that facilitates improved communication between the ICs of an emulation system that are used to emulate circuitry of a circuit design. The inventive arrangements described herein alleviate the bottleneck imposed by conventional inter-IC communication within an emulation system by providing low latency and high-speed serial communication links between ICs in the emulation system. Unlike conventional emulation systems that implement inter-IC communications using Select I/O, the inventive arrangements described herein are capable of accommodating increased levels of pin-multiplexing while avoiding significant slow-downs in the emulation clock that are typical of conventional emulation systems.

Select I/O refers to a class of input/output pins that can be driven high (VCC) or low (GND) directly through Register Transfer Level (RTL) code. In some ICs, Select I/O pins may be grouped in clusters called banks. The Select I/Os may be configured to operate at different voltages thereby allowing the IC to communicate with a range of different devices. Select I/Os are limited in terms of speed of operation to a range of approximately 500 MHz to 1.6 GHZ. By comparison, the examples described herein utilizing transceivers are capable of operating at speeds ranging from approximately 500 MHz to 28 GHz. Further aspects of the inventive arrangements are described below in greater detail with reference to the figures.

Figure 1:
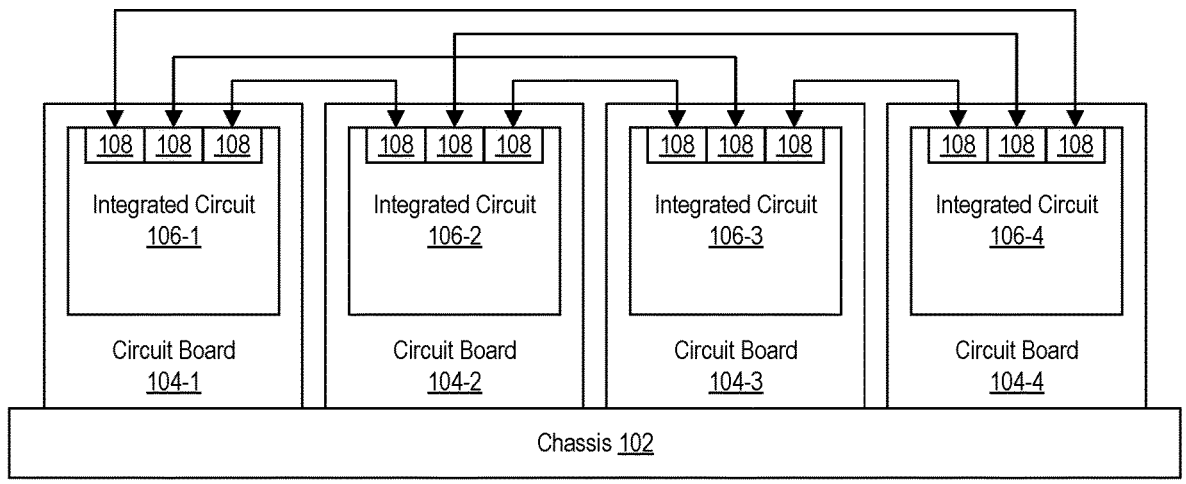
FIG. 1 illustrates an example of an emulation system using a plurality of integrated circuits (ICs) coupled using transceivers.

FIG. 1 illustrates an example of an emulation system 100. Emulation system 100 may be used to emulate a circuit design for an IC. The circuit design may be for a large System-on-Chip (SoC) or other type of IC that may be under development. The circuit design may be specified as an RTL description such as a netlist or using a hardware description language. The circuit design being emulated is typically too large to be emulated by a single IC thereby necessitating the need for emulation system 100 including a plurality of ICs.

For purposes of illustration, emulation system 100 includes a chassis 102 having a plurality of circuit boards 104 coupled thereto. The circuit boards may be cards that are inserted into appropriate card slots of chassis 102. Each circuit board 104 has an IC 106 disposed thereon. In one aspect, ICs 106 are programmable ICs. Examples of programmable ICs may include, but are not limited to, Field Programmable Gate Arrays (FPGAs), System-on-Chips (SoCs) having at least some programmable circuitry (e.g., programmable logic), Application-Specific ICs including at least some programmable circuitry, or other types of ICs that include programmable circuitry.

The circuit design to be emulated is subdivided, or partitioned, into smaller portions by a process referred to as partitioning. Each of the resulting portions of the circuit design, referred to as a "partition," may be mapped to, and implemented by, available circuit resources in programmable circuitry of one of ICs 106. In the example of FIG. 1, each IC 106 includes one or more transceivers 108. Transceivers 108 in one IC 106 may be connected to transceivers 108 in one or more other ICs 106 to effectuate high-speed, serial communication between ICs 106. While the example of FIG. 1 illustrates emulation system 100 having 4 different ICs 106, it should be appreciated that emulation system 100 may have fewer or more ICs 106 than shown.

Conventional emulation systems use inter-IC communications that are capable of operating at approximately 1.6 Gbps. The example implementations described within this disclosure, using transceivers 108, are capable of operating at speeds of approximately 28 Gbps. This means that a larger number of signals may be multiplexed onto the serial communication channels communicatively linking ICs 106 without a significant reduction in emulation speed of each IC 106. The serial communication channels shown may be cycle accurate.

Another benefit of using transceivers 108 is that the cost of implementing emulation system 100 may be significantly reduced. The reduction in cost arises from several factors. One factor is a reduction in the number of layers needed in circuit boards 104 due to the ability to convey a larger number of signals over the communication channels linking transceivers 108. This aspect of emulation system 100 may reduce the cost of each circuit board 104 by more than half. Another factor is that the cables that may be used as the serial communication channels between transceivers 108 cost significantly less than the cables used to link ICs in conventional emulation systems using Select I/O.

Emulation system 100 may be communicatively linked to a data processing system (not shown) and operate in coordination with, and/or under control of, such data processing system executing appropriate software. An example of a data processing system is described herein in connection with FIG. 12.

Figure 2:
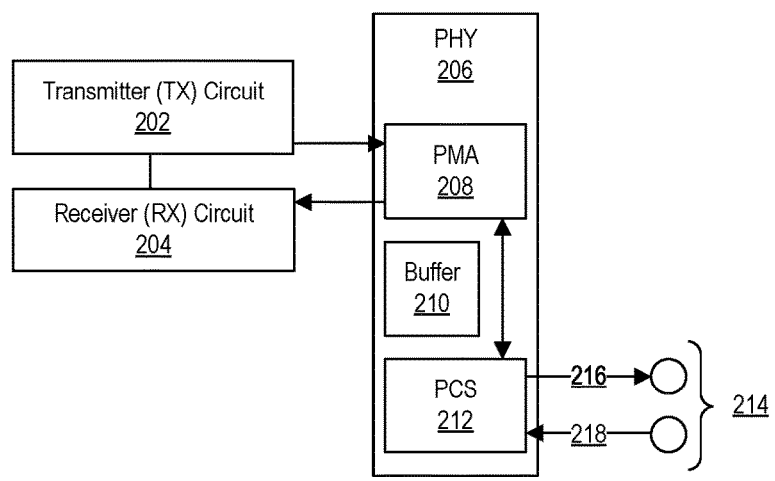
FIG. 2 illustrates an example implementation of a transceiver from the example of FIG. 1.

FIG. 2 illustrates an example implementation of a transceiver 108 from the example of FIG. 1. In the example of FIG. 2, transceiver 108 includes a transmitter (TX) circuit 202, a receiver (RX) circuit 204, and a physical layer circuit (PHY) 206. In one aspect, PHY 206 is implemented as a high-speed serial transceiver. In an example implementation, PHY 206 may be implemented as any of the various Multi-Gigabit Transceivers (MGTs) available in ICs from Xilinx, Inc. of San Jose, California. Still, it should be appreciated that other PHYs capable of operating as described herein may be used and that the inventive arrangements are not intended to be limited by the particular PHY implementation that is used.

PHY 206 includes a Physical Medium Attachment Sublayer (PMA) 208, a buffer 210, and a Physical Coding Sublayer (PCS) 212. PHY 206 may be subdivided into two portions corresponding to a transmit PHY and a receive PHY. For example, each of PMA 208 and PCS 212 may include a transmit portion and a receive portion. PCS 212 is coupled to the PCS of another one of transceivers 108 located in a different IC 106 of emulation system 100 over communication channel 214. Communication channel 214 is a serial communication channel. Communication channel 214 may include a serial transmit channel 216 and a serial receive channel 218. Each of channels 216 and 218 is implemented using differential signaling. Thus, though not shown, each of channels 216 and 218 is implemented using two-pins and corresponding wires. Communication channel 214 maintains the cycle accurate feature of emulation system 100 at IC 106 boundaries. That is, data may be sent via communication channel 214 from a partition implemented in one IC 106 to a partition in another IC 106 with the data being presented to the destination partition as expected in the same manner as if the two partitions were directly connected (e.g., in a same IC 106).

In the example of FIG. 2, PHY 206 is configured to bypass particular buffers that may be included in PHY 206. For purposes of illustration, buffer 210, which is located between PMA 208 and PCS 212 and may be included in the signaling path therebetween, may be bypassed. In one aspect, configuration data loaded into ICs 106 may specify the portion of the circuit design being emulated and include the particular configuration details for the various PHYs 206 of transceivers 108. In an example implementation, TX circuit 202 and RX circuit 204 may be implemented using programmable circuitry and couple to PHY 206 as illustrated.

In an example implementation, transceiver 108 is configured to operate in "raw mode." As defined within this disclosure, the term "raw mode" means that the transceiver is sending raw data and receiving raw data. Raw data is data that is sent over a communication channel without any line code having been applied to the data. For purposes of illustration, data sent over communication channel 214 is not encoded using a line code such as 8b10b or 64/66b, for example.

By operating PHY 206 in raw mode, latencies may be reduced by omitting any particular line code running over communication channel 214. Omission of buffers between PMA 208 and PCS 212 further reduces latencies and reduces unpredictability in communications between ICs 106 in emulation system 100. In addition, alignment logic within PCS 212 (not shown) may be disabled to further reduce latency in PHY 206. In the example of FIG. 2, the enumeration logic, which is configured to locate byte boundaries for channel alignment, is architected so that alignment is limited to a 32-bit (e.g., a 4 byte) boundary. If alignment cannot be achieved, the alignment starts anew. This mechanism ensures minimum and predictable latency. In bypassing buffers such as buffer 210, however, phase alignment must be implemented as part of the user logic (e.g., user circuitry being emulated that couples to TX circuit 202 and/or RX circuit 204).

Figure 3:
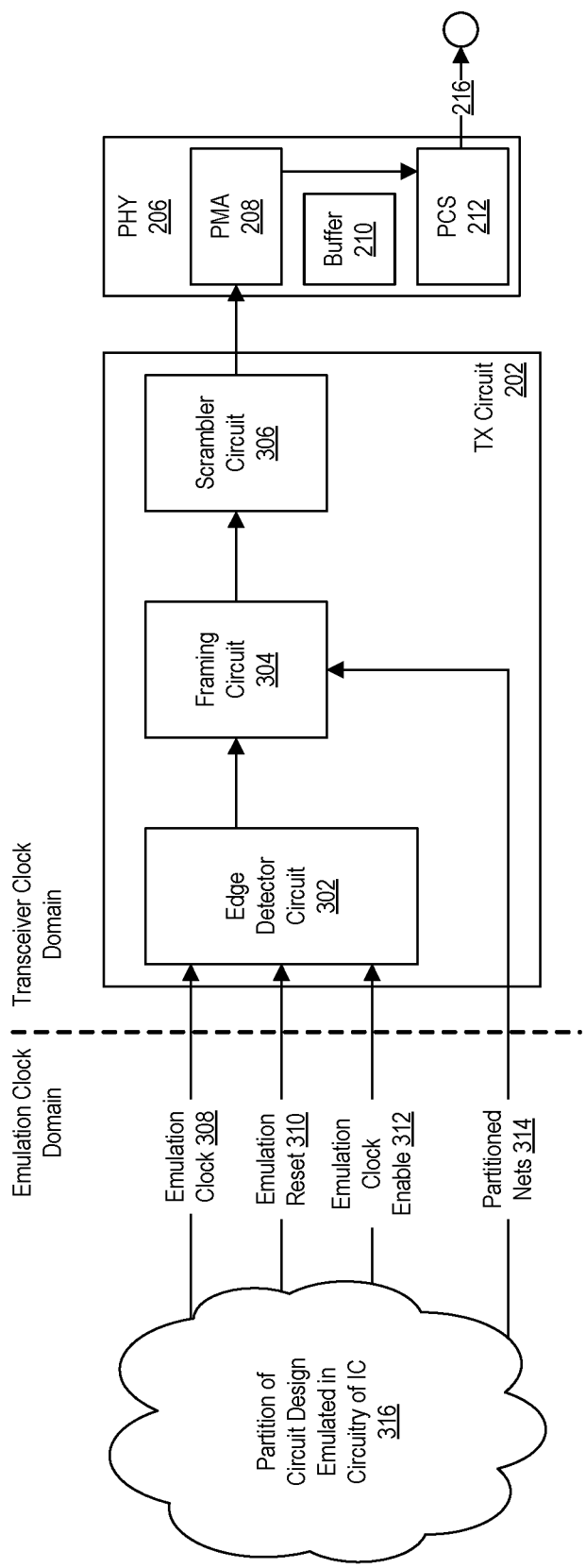
FIG. 3 illustrates an example implementation of a transmitter circuit of the transceiver of FIG. 2.

FIG. 3 illustrates an example implementation of TX circuit 202 of transceiver 108. In the example, the circuitry that emulates the partition of the circuit design (circuitry 316) operates in a different clock domain (or domains) than transceiver 108. The emulation clock domain refers to a clock of circuitry 316 of IC 106 that is emulating a partition of the circuit design. TX circuit 202 and PHY 206 are clocked by a transceiver clock and are in the "transceiver clock domain." The transceiver clock is asynchronous with the emulation clock and runs at a frequency that is higher than the emulation clock. In one aspect, the transceiver clock may be set based on the desired line rate for communication channel 214.

Edge detector circuit 302 receives signals such as emulation clock 308, emulation reset 310, and emulation clock enable 312. Edge detector circuit 302 is capable of detecting edges of emulation clock 308 and the state of emulation reset 310 and emulation clock enable 312. Edge detector circuit 302 is capable of initiating (e.g., starting) and stopping operation of framing circuit 304.

Framing circuit 304 receives partitioned nets 314. Partitioned nets 314 are nets of the circuit design being emulated that have been cut from partitioning and now must cross from one IC 106 to another IC 106 within emulation system 100. In the examples described within this disclosure, only signals in a same clock domain may be routed to, and processed by, transceiver circuit 108. For example, emulation clock 308, emulation reset 310, emulation clock enable 312, and partitioned nets 314 are in the same clock domain. Another emulation clock domain of circuitry 316 would connect to a different transceiver within IC 106. Thus, each of partitioned nets 314 is governed by emulation clock 308 and belongs to the same emulation clock domain.

Framing circuit 304 is capable of sampling signals of partitioned nets 314 and generating packets of emulation data from the sampled signals. In one aspect, framing circuit 304 is capable of generating and adding an error-detection code to the packets that are generated. In an example implementation, the error-detection code is one or more Cycle Redundancy Checks (CRCs). In another example implementation, the error-detection code is a parity bit or bits.

Scrambler circuit 306 is capable of scrambling the packetized emulation data received from framing circuit 304. Scrambling the packetized emulation data helps to maintain DC balancing and clock data recovery (CDR). In one aspect, scrambler circuit 306 applies multiplicative scrambling to the data. Additive scrambling requires a receiver to be synchronized with a known pattern. By comparison, multiplicative scrambling is self-synchronizing and need not be synchronized as is the case with additive scrambling. Further, as the environment in which emulation system 100 is used is largely known, controlled, and not considered harsh or noisy, multiplicative scrambling is suitable. In the example of FIG. 1, synchronization between transceivers 108 may be achieved using a synchronization (synch) pattern. In one aspect, the scrambler circuit in TX circuit 202 and descrambler circuit in RX circuit 204 may be reset at periodic intervals to adjust for drift during periods of long operation.

Before transceiver 108 is able to communicate user emulation data to another transceiver coupled to communication channel 214, the transceivers need to be enumerated and achieve block lock. In an example implementation, framing circuit 304, e.g., upon power on or upon reset, is capable of transmitting signals as a training pattern referred to as TP1 via transmit channel 216 to another transceiver coupled to transmit channel 216. In response to the other transceiver (e.g., the RX circuit thereof) receiving TP1 and aligning with TP1, the TX circuit of the other transceiver transmits a block lock training pattern referred to as TP2 to transceiver 108 (e.g., to RX circuit 204). In response to receiving TP2, transceiver 108 is ready to begin transmitting user data. In an example implementation, as a precautionary measure, the enumeration process described above may be repeated multiple successive times (e.g., 3 times) to avoid accidental data alignment and block lock corresponding to accidental detection of TP2.

The enumeration logic described above (e.g., TX circuit 202 and RX circuit 204) requires few resources and has a small footprint on IC 106, thereby leaving most of the circuit resources of IC 106 available for emulation. Once communication channel 214 is enumerated, emulation data (e.g., user data) may be transmitted. Transmission of emulation data via communication channel 214 may begin with edge detector circuit 302 detecting an active edge of emulation clock 308 (e.g., either a rising or falling edge). In response to detecting an active edge, edge detector circuit 302 notifies framing circuit 304. In response, framing circuit 304 latches incoming signals, e.g., data, on partitioned nets 314. Data from partitioned nets 314 is sampled in the transceiver clock domain. Framing circuit 304 is capable of packetizing the emulation data before sending to scrambler circuit 306 and PHY 206. In one aspect, each packet may be structured to include a Start of Frame (SOF), data, and an End of Frame (EOF). As noted, framing circuit 304 may also be configured to add an error-detection code to each packet. In the example of FIG. 3, to keep the latency low, instead of using regular synchronizer circuits, clock-enable synchronizers are inferred.

In one aspect, as part of the design flow to implement the circuit design in emulation system 100, any nets crossing from the emulation clock domain, e.g., partitioned nets 314, are timed with delay constraints such as "set_max_delay" constraints. The "set_max_delay" constraint establishes a data valid window that allows the signal to be stable before the signal is latched in the transceiver clock domain. The delay constraints serve to reduce latency in the resulting circuitry as signals cross from the emulation clock domain to the transceiver clock domain. Since the "set_max_delay" with "data_path_only" flag does not account for clock skew, additional margin may be included before data is captured by framing circuit 304.

The approach described herein, where emulation clock 308 is received by edge detector circuit 302, eliminates the need for clock domain circuits such as First-In-First-Out (FIFO) memories and/or Block Random Access Memories (BRAMs) designed for a multi-bit bus. Such is the case as the data received over partitioned nets 314 is aligned with emulation clock 308. Having received data that is time aligned with emulation clock 308, there is no need for clock domain crossing circuitry to address meta-stability since stability of the data may be accurately predicted in the transceiver clock domain and circuitry therein may be timed to latch stable data.

Electronic Design Automation (EDA) tools use multiple approaches for emulating circuit designs. For example, some EDA vendors use PLL's to generate design/emulation clocks, whereas other vendors use fixed, high-frequency clocks for all sequential logic coupled with low-speed data enables. The active edge detection logic described herein as implemented in edge detector circuit 302 is capable of detecting the start of a cycle of emulation clock 308 when present. Edge detector circuit 302 is also capable of successfully detecting a start of a cycle in cases where emulation clock enable 312 is present. Once the start of frame is detected, edge detector circuit 302 is capable of triggering framing circuit 304 to start packetization and transmission. Edge detector circuit 302 is also capable of generating the necessary enables for latching data by framing circuit 304.

Figure 4:
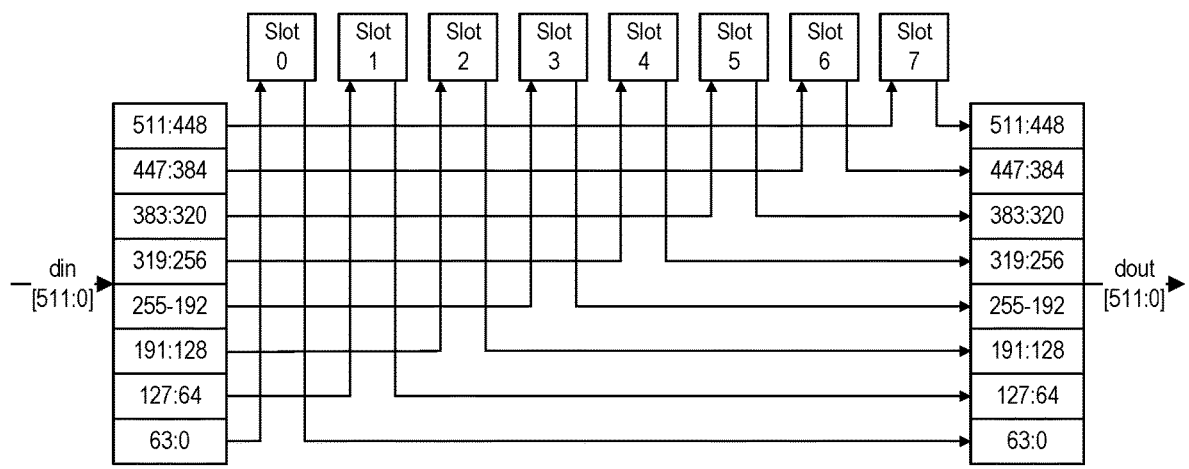
FIG. 4 illustrates an example of scheduling as performed by a framing circuit of the transceiver of FIG. 3.

FIG. 4 illustrates an example of scheduling performed by framing circuit 304. For purposes of discussion, the term "slot" means the particular clock cycle of the transceiver clock on which data from partitioned nets 314 is or will be captured. Framing circuit 304 is configured so that not all data from partitioned nets 314 is captured on the first occurrence or same occurrence of the transceiver clock. Rather, of the received signals comprising the emulation data from partitioned nets 314, a portion of such data referred to as a group (e.g., a subset of the signals) is captured on the first occurrence of the transceiver clock (e.g., the first slot). Further groups (e.g., subsets) of the signals comprising the emulation data are captured on subsequent slots. For example, N different signals (the N signals of partitioned nets 314) may be broken out into M different groups of signals. Each group of signals is sampled on a different slot. Framing circuit 304 is capable of sampling signals of partitioned nets 314 as described herein prior to generating packets of emulation data.

As an illustrative and nonlimiting example, consider the case where N=512 and M=8. In this example, the transceiver clock runs at 8 times the frequency of the emulation clock providing 8 slots on which the received emulation data may be sampled. That is, for a given cycle of the emulation clock, there are 8 slots (e.g., 8 cycles) of the transceiver clock. Thus, the emulation data may be divided into 8 groups, where each group is captured on a different slot. In the example, a signal "din" (corresponding to partitioned nets 314) is received. Din is 512 bits in width (e.g., N=512). In the example, din is organized into 8 groups, where each group includes 64 bits of the 512-bit signal. At slot (e.g., clock cycle) 0, bits 0:63 are sampled. At slot 1, bits 64:127 are sampled and so forth as illustrated in FIG. 4. In general, groups of 64 bits of the received din signal are sampled on each clock cycle, or slot, of the transceiver clock.

It should be appreciated that groups may be formed to include other numbers of signals. For example, while FIG. 4 shows groups of 64 signals, in other implementations, 32 bits may be used to form groups. In one aspect, the number of signals included in a group and sampled at each slot may correspond to, or equal, the width of PHY 206 (e.g., PMA 208).

Referring again to FIG. 4, slot 0 is the closest slot to the emulation clock cycle on which the emulation data is received and, as such, has the highest timing penalty. For purposes of illustration, the transceiver clock may have a frequency of 200 MHz and a period of 5 ns. Thus, the setup for all signals allocated to slot 0 is 5 ns. Each subsequent slot has a setup time that increments 5 ns. For example, the setup times for all signals in each respective one of slots 0-7 in ns are 5, 10, 15, 20, 25, 30, 35, and 40. By organizing signals into groups as shown, different timing constraints may be applied to the different groups based on slot assignment. For example, for each group of signals, a group timing exception MCP (Multi-Cycle Path) attribute may be added to relax the setup requirements for the group. For example, slot 0 will have the most stringent timing constraints of slots 0-7 applied on the TX side (e.g., 5 ns) and the most relaxed timing constraints (e.g., 40) of slots 0-7 on the RX side. Appreciably, the TX side refers to the transmit portion of a transceiver located in a first IC 106 (data sender) while the RX side refers to the receiver portion of a transceiver located in a second and different IC 106 (data recipient). By comparison, slot 7 will have the most relaxed timing constraints (e.g., 40 ns) of slots 0-7 applied on the TX side and the most stringent timing constraints (e.g., 5 ns) of slots 0-7 applied on the RX side.

The timing constraints that are applied to partitioned nets 314 in consequence of the slots used by transceivers 108 may be leveraged by the EDA tools including the partitioner. During partitioning performed on the circuit design, for example, the partitioner may allocate timing critical nets of partitioned nets 314 with high timing delays to later slots while nets of partitioned nets 314 that are not critical or are less critical and have low timing delays may be assigned to earlier slots. Other signals may be assigned to respective groups based on logic delays or logic levels to improve performance (e.g., reduce timing violations).

Partitioned nets 314 may be constrained in the circuit design using "max_delay" constraints and introducing necessary delay setups so that nets assigned to slot 0 have the highest timing penalty while nets assigned to slot 7 have the lowest timing penalty. By applying constraints as described, place and route tools are better able to reach a solution as circuit components generating signals assigned to higher slots may be located farther away from transceiver 108. Since PHY 206 is an asynchronous interface, there is no need to constrain pins of PHY 206. By comparison, when using Select I/Os in conventional emulation systems, the Select I/Os are timed for input and output delays.

Figure 5A:
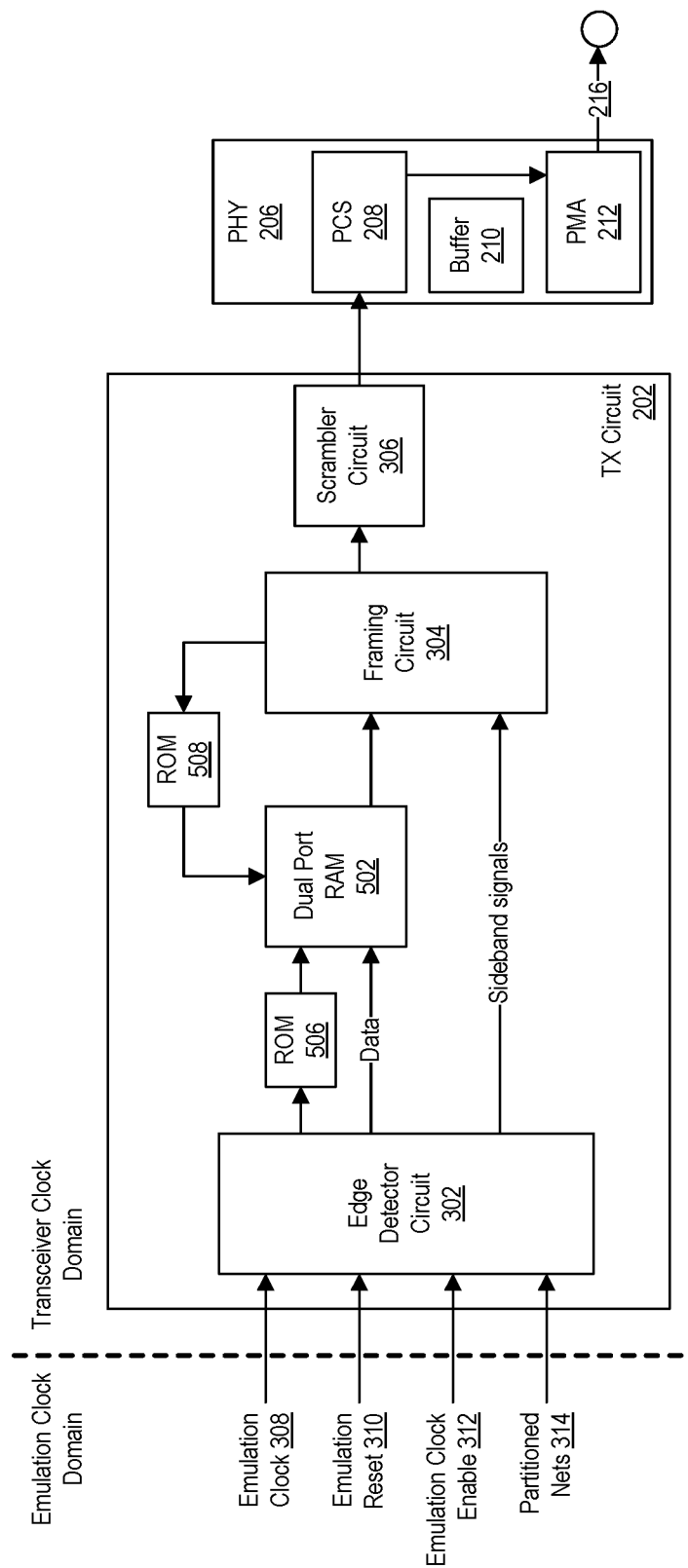
FIGS. 5A and 5B illustrate other example implementations of a transmitter circuit of the transceiver of FIG. 2.
Figure 5B:
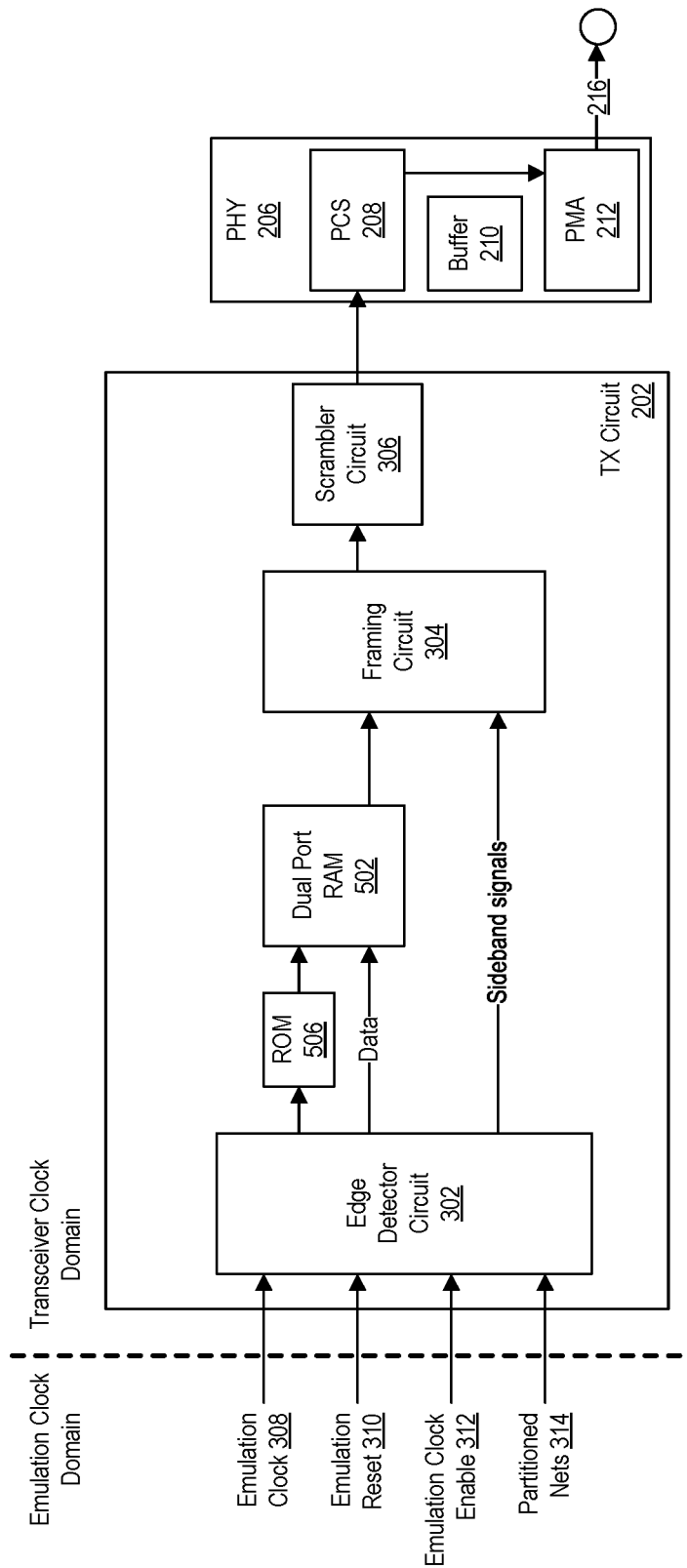

FIGS. 5A and 5B illustrate other example implementations of TX circuit 202 of transceiver 108. The examples of FIGS. 5A and 5B are capable of reshuffling slots post implementation of a circuit design to be emulated. In the examples of FIGS. 5A and 5B, edge detector circuit 302 receives partitioned nets 314 and samples partitioned nets 314 as opposed to framing circuit 304. Still, edge detector circuit 302 is capable of operating the same as, or substantially as, described with reference to FIG. 4 in connection with sampling emulation data at different slots. Framing circuit 304 still may generate packetized data.

Referring to FIG. 5A, the example TX circuit 202 is capable of performing a fine-grained slot adjustment. In the example of FIG. 5A, a dual port RAM 502 is included that allows for reshuffling of slots post implementation. Edge detector circuit 302 is capable of writing emulation data to dual port RAM 502 via a first port, while framing circuit 304 is capable of reading emulation data from dual port RAM 502 from a second port. Typically, read and write addresses provided to a dual port RAM may be generated using a counter that rolls over depending on the width of the data and the relationship between the clocks on the two ports. In the example of FIG. 5A, a read only memory (ROM) 506 is included between the address counter of edge detector circuit 302 that generates address signals and the address portion of the write port of dual port RAM 502. The counter of edge detector circuit 302 provides read addresses for ROM 506, where the values read from ROM 506 at the provided addresses are used as the write addresses for dual port RAM 502. Similarly, a ROM 508 is included between the address counter of framing circuit 304 that generates address signals and the address portion of the read port of dual port RAM 502. The counter of edge detector circuit 302 provides read addresses for ROM 506, where the values read from ROM 506 at the provided addresses are used as the read addresses for dual port RAM 502.

In the example of FIG. 5A, post implementation of the circuit design in ICs 106 of emulation system 100, different values may be written to ROMs 506 and 508 to change the order in which data is written and read from dual port RAM 502 to one that is non-sequential. This architecture allows the allocation of a particular group of signals to a given slot to be changed after the circuit design has been physically implemented in ICs 106 of emulation system 100. Re-implementation (e.g., partitioning, synthesis, placement, routing, etc.) is not required to make such a change.

The example implementation of FIG. 5A is capable of performing fine-grained timing adjustments to address timing violations by shuffling data between two adjacent slots. For example, the TX circuit 202 of FIG. 5A is capable of swapping data between any two adjacent slots such as between slots 0 and 1, between slots 1 and 2, between slots 2 and 3, etc. The fine-grained adjustment performed by the TX circuit 202 of FIG. 5A does not require any special handling on the part of RX circuit 204. For purposes of illustration, the TX circuit 202 of FIG. 5A may be paired or used with the RX circuit 204 of FIG. 6A.

The example of FIG. 5A exploits a characteristic of dual port RAM 502 where data that is written thereto is available to be read out 1 or more clock cycles earlier than the time at which dual port RAM 502 indicates that the data is ready. The use of ROMs 506 and 508 allows data to be written to dual port RAM 502 in a manner that swaps the data in two adjacent slots and reads the data out from dual port RAM 502 to framing circuit 304 in the correct or original order. For example, consider the case where data A is written to slot 0, data B to slot 1, and so forth up to data H to slot 7. Data B may have a timing violation of 2 ns, while data C has excess slack of 2 ns. In that case, using ROM 506, data may be written to slots 0-7 in dual port RAM 502 in the order A, C, B, D, E, F, G, H. Data may be read out of dual port RAM 502, using ROM 508, in the order A, B, C, D, E, F, G, H. As such, the data arrives at framing circuit 304 in the original order negating the need for a ROM to be implemented in the RX circuit 204 to place the data back in the original or expected order. Data may be read from dual port RAM 502 earlier than when indicated as ready by dual port RAM 502 to exploit the characteristics described thereby allowing small timing adjustments to the data where data in two adjacent slots may be swapped to alleviate a timing violation.

Referring to FIG. 5B, the example TX circuit 202 is capable of performing a coarse-grained slot adjustment. The TX circuit 202 of FIG. 5B is substantially similar to that of FIG. 5A with the exception that ROM 508 is omitted. The example TX circuit 202 of FIG. 5B is capable of swapping data between any two slots. The slots having data swapped need not be adjacent. For example, TX circuit 202 of FIG. 5B may swap data between slot 0 and slot 7 to alleviate a timing violation without introducing any error or other timing violations into the circuit design. In using the TX circuit 202 of FIG. 5B, however, the RX circuit 204 is adjusted to include a ROM so that data may be shuffled back into the original or expected slot prior to providing the data to the partitioned net. The example TX circuit 202 of FIG. 5B would be used, or paired with, the example RX circuit 204 of FIG. 6B.

Were a timing violation to occur without the architectures of FIG. 5A or 5B, the emulation clock may need to be reduced thereby slowing operation of emulation system 100. In the example of FIGS. 5A and 5B, the group including the critical signal(s) may be assigned to a different slot, e.g., one that is later in time to avoid the timing violation. That is, the slot of a group may be changed dynamically and swapped with the slot of another group during operation of emulation system 100 subsequent to the circuit design being implemented therein since ROMs 506 and/or 508 may be written (or re-written) using appropriate administrative tools thereby avoiding re-implementation of the circuit design. Accordingly, in cases where the implementation reduces speed of the emulation clock due to the timing of a particular group, the corresponding slot of the group can be changed dynamically and swapped with the slot of another group that has extra timing margin. This technique helps to boost emulation clock performance post-implementation and can save significant time that would otherwise be spent re-partitioning the circuit design and performing placement and routing. In swapping slots, both of the RX and TX sides may be considered to ensure that a timing problem is not simply moved from one side to the other since gaining margin on the TX side (RX side) results in a loss of margin on the RX side (TX side). For some large circuit designs, the amount of time saved by not having to re-partition and/or re-implement the circuit design exceeds 24 hours.

Figure 6A:
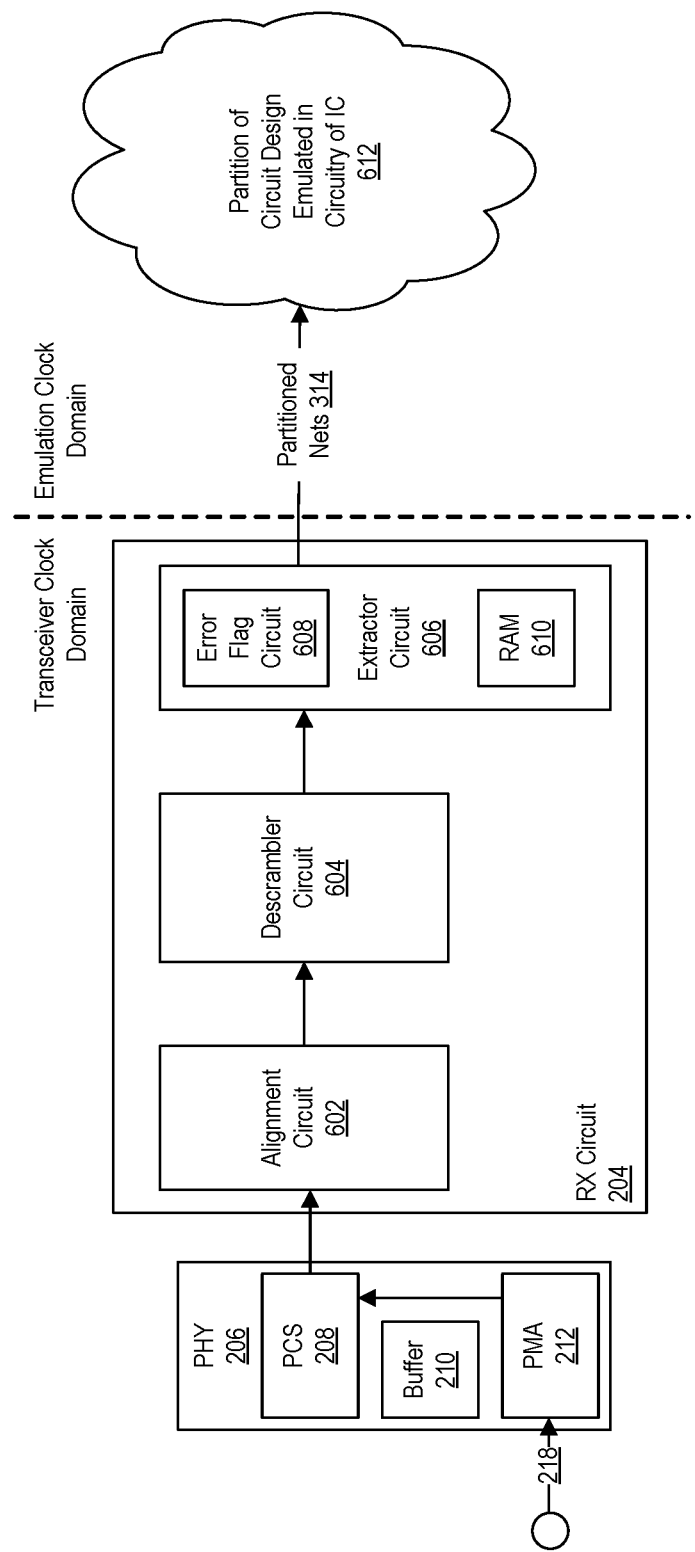
FIGS. 6A and 6B illustrate example implementations of a receiver circuit of the transceiver of FIG. 2.
Figure 6B:
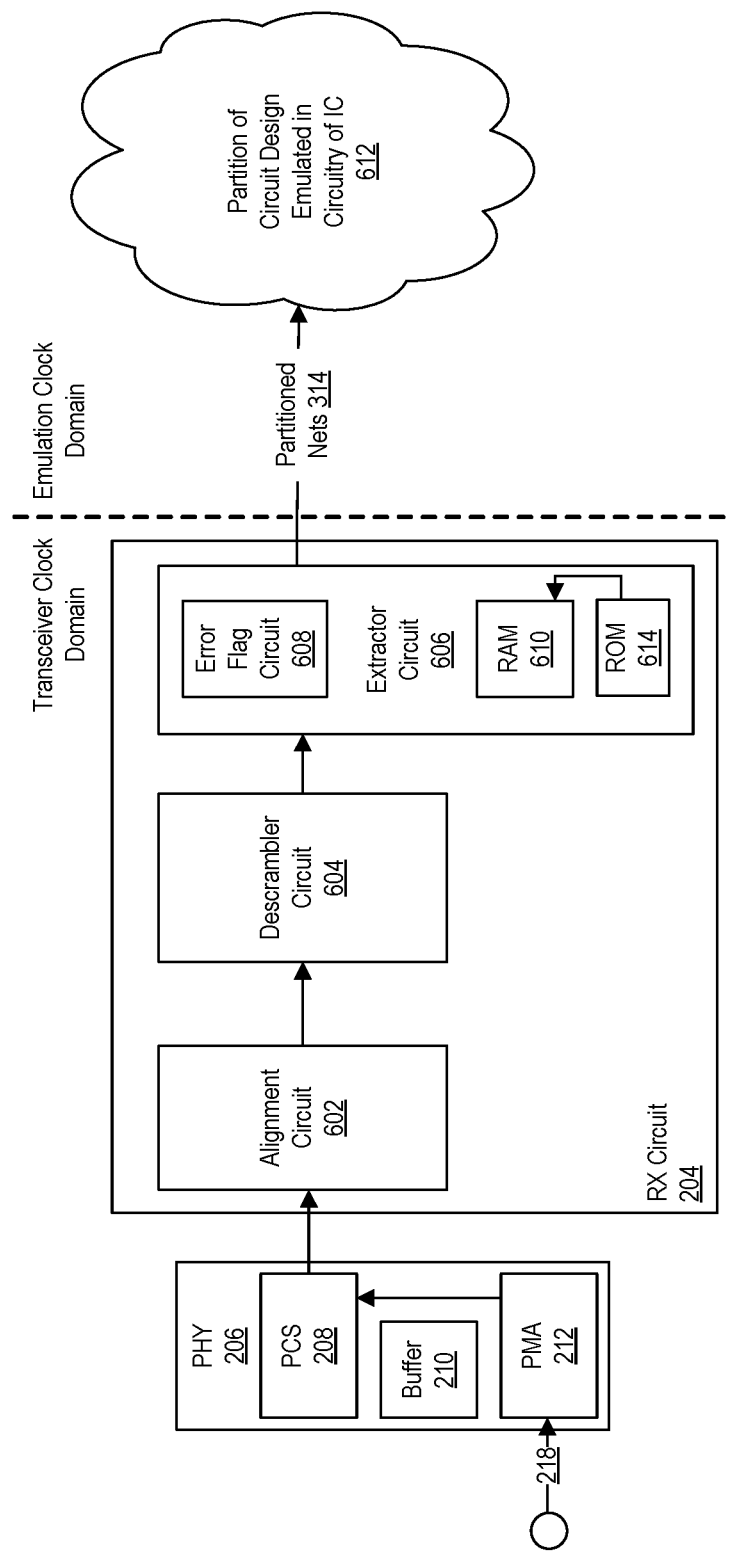

FIGS. 6A and 6B illustrate example implementations of RX circuit 204 of transceiver 108. In the example of FIG. 6A, RX circuit 204 includes an alignment circuit 602, a descrambler circuit 604, and an extractor circuit 606. Alignment circuit 602 is capable of performing clock alignment with the signal received via receive channel 218. In one aspect, alignment circuit 602 may be coupled to framing circuit 304 of TX circuit 202 at least for purposes of performing block alignment as previously described herein. For example, alignment circuit 602 may detect TP1 on communication channel 218 and, in response thereto, notify framing circuit 304 to begin sending TP2 over communication channel 216.

Descrambler circuit 604 is capable of performing the inverse operation performed by scrambler circuit 306. Extractor circuit 606 is capable of demultiplexing the received emulation data and sending the demultiplexed emulation data as signals on partitioned nets 314 to the circuitry 612 in IC 106 that is emulating the circuit design.

In the example of FIG. 6A, extractor circuit 606 includes an optional error flag circuit 608. Error flag circuit 608 is capable of recalculating the error-detection code on each packet and comparing the recalculated error-detection code with the error-detection code included with the packet itself by the TX circuit. Error flag circuit 608 is capable of registering or flagging an error (e.g., storing an error flag or bit) in response to determining a mismatch between the error-detection code of the packet and the error-detection code re-calculated for the packet by error flag circuit 608. As noted, the error-detection code may be one or more CRCs or parity bit(s).

Extractor circuit 606 may also include a RAM 610. In the example of FIG. 6A, RAM 610 may be a single port RAM. Data is stored in RAM 610 in the order received and read out in the order received. Accordingly, the example RX circuit 204 of FIG. 6A may be used with the example TX circuits described in connection with FIG. 3 and/or FIG. 5A (e.g., fine-grained adjustment where data is sent in the expected order).

In one aspect, PHY 206 is configurable to operate in a 32-bit mode or a 64-bit mode. The 32-bit mode may be used with lower line rates, while the 64-bit mode may be used with higher line-rates. Operation of PHY 206 may be limited to 32-bit and 64-bit to bypass circuits such as any TX and/or RX up/down-size circuits as such circuits introduce additional latency into the signal path.

Referring to FIG. 6B, the example RX circuit 204 shown is substantially similar to that of FIG. 6A. In the example of FIG. 6B, a ROM 614 is included to adjust addresses provided to the read port of RAM 610. Inclusion of ROM 614 allows RX circuit 204 of FIG. 6B to reorder data that may have been reshuffled using the coarse-grained approach implemented in the example TX circuit 202 of FIG. 5B. For example, ROM 614 may be written with data that reverses the data swap between slots implemented in TX circuit 202 so that the correct data is output to circuitry 612. That is, data may be written to RAM 610 in the order received (e.g., which may be reshuffled) and read out in the correct or expected order where the shuffling is reversed.

FIG. 7 illustrates an example packet 700 that may be generated by framing circuit 304 with PHY 206 operating in a 64-bit mode. In the example of FIG. 7, packet 700 may include a "Start of Frame" or "SOF" followed by data. Following the data, packet 700 may include an "End of Frame" or "EOF." Following the EOF, packet 700 may include a first CRC and a second CRC as the error-detection code. Framing circuit 304 is capable of generating the CRCs as the error-detection code and appending the error-detection code following the EOF within packet 700. In the example of FIG. 7, one 32-bit CRC is generated for the upper word and a second 32-bit CRC is generated for the lower word. The two 32-bit CRCs, which are calculated separately, are concatenated and added to packet 700. Two 32-bit CRCs are used in lieu of a single 64-bit CRC since a 32-bit CRC may be replicated in the case of 64-bit data of a double word.

FIG. 8 illustrates another example of packet 700 that may be generated by framing circuit 304 with PHY 206 operating in a 32-bit mode. In the example of FIG. 8, packet 700 may include an SOF followed by data. The EOF follows the data. Framing circuit 304 is capable of generating a CRC as the error-detection code and appending the error-detection code following the EOF.

FIG. 9 illustrates yet another example of packet 700 that may be generated by framing circuit 304 in either 32-bit mode or 64-bit mode. In the example of FIG. 9, packet 700 may include an SOF followed by data and the EOF. Framing circuit 304 is capable of generating one or more parity bits as the error-detection code and appending the error-detection code following the EOF. The parity bit(s) may be added following the EOF to ease timing requirements.

With reference to FIGS. 7-9, the SOF and EOF mark the beginning and end, respectively, of a packet. The length of the packet is defined by the multiplexing ratio. For example, a 1024-bit multiplexing ratio with PHY 206 operating in 64-bit mode has a packet length of 1 (SOF)+1024/64 (data)+1 (2×CRC-32)+1 (EOF). A 64-bit PHY mode with a 1024:1 multiplexing ratio consists of 19 beats.

In the examples, the SOF and EOF may be implemented as special characters set with a specific value. In such an arrangement, detecting SOF and EOF does not require full 32-bit or 64-bit comparison as the case may be, so that to detect SOF/EOF, full 32-bit or 64-bit comparators are not needed. Instead, comparators may be designed that need only evaluate a few bytes/nibbles to successfully detect SOF and EOF. This configuration for implementing comparators to detect SOF and/or EOF requires fewer resources in ICs 106.

In the examples of FIGS. 7-9, the error detection codes (e.g., parity bit(s) and/or CRC(s)) are shown as being appended after the EOF. In the examples, placing the error detection codes to follow the EOF allows timing constraints to be relaxed adding additional margin (e.g., 5 ns using the example clock frequencies described herein). The error detection codes need not be subject to the same timing constraints as the underlying data and/or EOF of the packet thereby reducing the number of timing violations that occur. It should be appreciated that in other example implementations, the error detection codes may be placed prior to the EOF, e.g., between the data and the EOF for a packet though the relaxation in timing may not be achieved.

Figure 10:
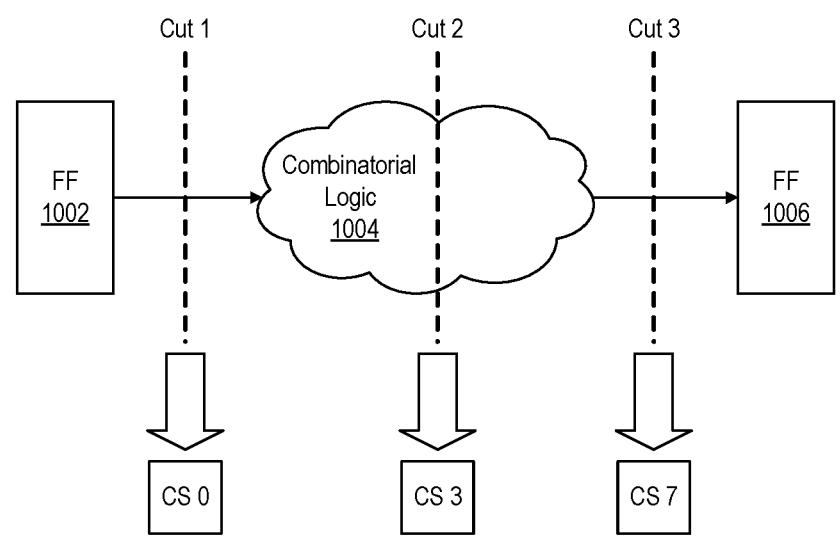
FIG. 10 illustrates an example technique for reshuffling slots during the partitioning operation.

FIG. 10 illustrates an example technique for reshuffling slots during the partitioning operation. The example of FIG. 10 illustrates how net assignment to slots may be used to aid in the partitioning process. The example of FIG. 10 illustrates three different example cuts that may be applied to the net shown resulting in a different partitioning for each cut.

In the example, the net starts at μF 1002 (driver), traverses through combinatorial logic 1004, and ends at FF 1006 (load).

In the case where the net is partitioned using cut 1, the net is broken near FF 1002. Accordingly, FF 1002 is located in the driving IC 106 (TX side). Combinatorial logic 1004 and FF 1006 are located in the destination IC 106 (RX side). Using cut 1 for the partition causes the driving IC including FF 1002 to have minimum timing impact as there are no logic levels. Accordingly, the net may be scheduled to slot 0. As discussed, the nets assigned to slot 0 on the TX side have a high timing penalty and must adhere to one slot clock cycle. Slot 0 on the RX side, however, has the highest timing margin of the slots since nets assigned to slot 0 arrive the earliest thereby allowing for relaxed timing (e.g., more time to reach the load). Accordingly, referring to the prior example clock speeds, using cut 1 with the net assigned to slot 0, the setup time on the TX side will be 5 ns. In the destination IC on the RX side, the net may be scheduled with relaxed timing to allow the signal on the net time to traverse through combinatorial logic 1004 to FF 1006. The setup time on the TX side will be up to 40 ns.

In the case where cut 2 is used for the partitioning, combinatorial logic 1004 is subdivided so that a portion of combinatorial logic 1004 is located on the TX side and the other portion of combinatorial logic 1004 is located on the RX side. In that case, the net may be assigned to an intermediate slot such as slot 3. Slot 3 offers a balanced timing penalty with respect to both the TX and RX sides.

In the case where cut 3 is used for the partitioning, the net on the driving side is scheduled to slot 7 so that timing is more relaxed on the TX side. On the RX side, however, slot 7 results in the highest timing penalty with the minimum setup time.

The example of FIG. 10 illustrates how usage of the slots described herein by the TX and RX circuits provides the partitioner with greater flexibility. The partitioner is capable of generating a partitioning of the circuit design in less time due, at least in part, to the flexibility in timing provided by scheduling of signals to slots. The partitioner may be included as an EDA tool that may be executed using a system as described in connection with FIG. 12.

In a conventional emulation system that uses Select I/O based pin multiplexing, the partitioning tool spends a significant amount of time finding the lowest multiplexing ratios to keep the emulation clock high. Recall that the lower the pin multiplexing ratio, the higher the emulation clock frequency. Within conventional emulation systems using Select I/O, moving from one multiplexing ratio to the next incurs a significant performance penalty. This penalty may be as low as 10%, but is often more than a 10% slow-down in the emulation clock frequency. Because of the significant performance penalty incurred, the partitioner tends to be particularly vigilant in finding a partitioning solution for the circuit design having the lowest multiplexing ratios. It is not uncommon for a partitioner to run for many hours to partition a complex circuit design.

In accordance with the inventive arrangements described within this disclosure, since the slots are at the 32/64-bit boundary that transmit out at the PHY line-rate (e.g., up to 26 Gbps), the penalty of moving to the next multiplexing ratio is typically a reduction in emulation clock frequency of about 5% or less. In many cases, the penalty is closer to a 1% slow-down. The lower penalty means that the partitioner may move to a next higher multiplexing ratio without incurring a noticeable performance degradation. As such, the partitioner may be less strict. Further, in increasing the multiplexing ratio, the partitioner may have more than enough slots available so as to not use, or ignore, one or more of the lower slots such as slot 0. The inputs to circuitry corresponding to slot 0, for example, may be tied to ground by the EDA tools. The partitioner would start assigning partitioned nets to slot 1 and proceed to assign signals to slots 2, 3, 4, 5, 6 and 7, with slot 0 being unused. The largely penalty free ability to move to a next higher multiplexing ratio means that the partitioner is able to generate a partitioning of a larger circuit design in much less time than would otherwise be the case. A partitioner configured to operate as described within this disclosure using the transceiver architectures described may complete a partitioning of a circuit design hours before a partitioner using conventional techniques. Table 1 below illustrates example data points showing the performance penalties incurred with respect to emulation clock speed as the multiplexing ratio is increased for a Select I/O solution and the inventive arrangements described herein (the transceiver solution).

TABLE 1

| Transceiver Solution | | Select I/O Solution | |
| --- | --- | --- | --- |
| TDM Ratio | Emulation Clock (MHZ) | TDM Ratio | Emulation Clock (MHZ) |
| 512:1 | 17.17 | 8:1 | 20.00 |
| 576:1 | 16.49 | 16:1 | 17:24 |
| 640:1 | 15.86 | 24:1 | 15.63 |
| 704:1 | 15.27 | 32:1 | 14.29 |

The example implementations described within this disclosure also provide lower latencies compared to other emulation systems. Table 2 below illustrates total latency achieved for various line rates.

TABLE 2

| PHY Data Width | Line Rate (Gbps) | Total Latency in ns (TX + RX) |
| --- | --- | --- |
| 32 | 10.3125 | 36.751 |
| 32 | 12.5 | 30.480 |
| 32 | 13.75 | 27.781 |
| 64 | 16.25 | 43.384 |
| 64 | 20.625 | 34.375 |
| 64 | 25.3125 | 28.207 |
| 64 | 26.5625 | 26.917 |

Figure 11:
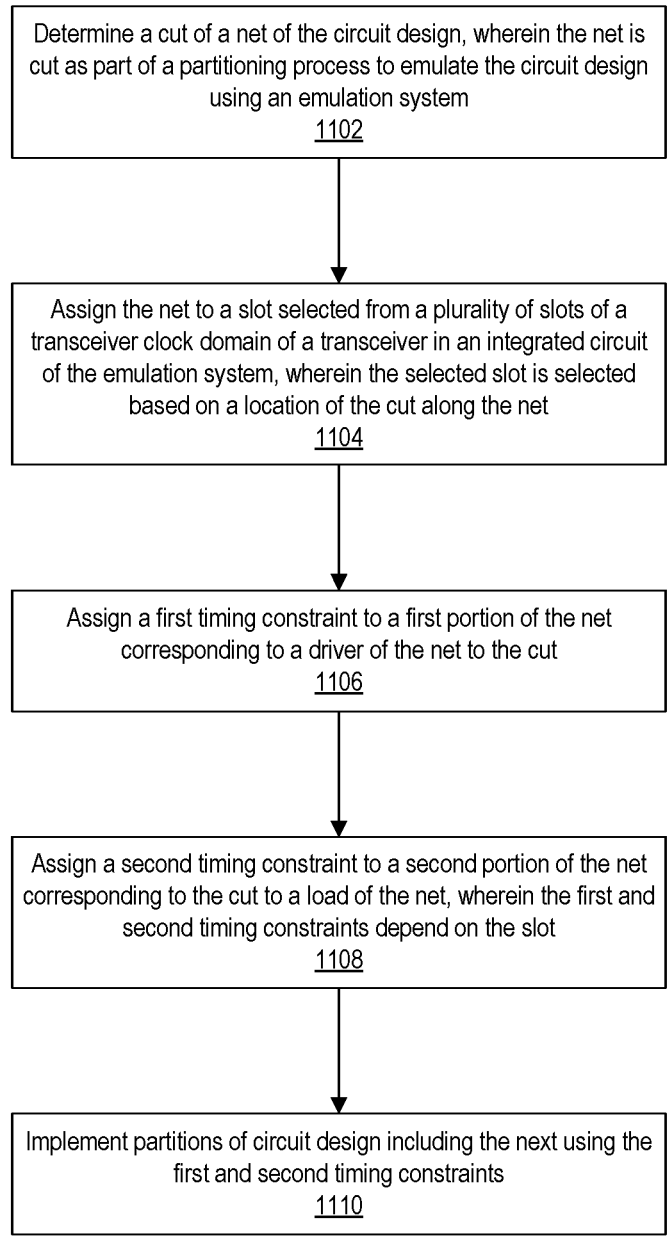
FIG. 11 illustrates an example method of implementing a circuit design in an emulation system that includes a plurality of ICs.

FIG. 11 illustrates an example method 1100 of implementing a circuit design in an emulation system that includes a plurality of ICs. Method 1100 may be performed or executed by a data processing system (system) as described in connection with FIG. 12 to partition a circuit design that is to be emulated using an emulation system as described in connection with FIG. 1.

In block 1102, the system is capable of determining a cut of a net of the circuit design. The system is capable of cutting the net as part of a partitioning process that is performed to emulate the circuit design using an emulation system. Each resulting partition of the circuit design may be assigned to, and emulated by, circuitry in a different IC 106.

In block 1104, the system is capable of assigning the net to a slot selected from a plurality of slots corresponding to a transceiver clock of a transceiver in an IC 106 of emulation system 100. In one aspect, the selected slot is selected based on a location of the cut along the net. For example, the system may select a slot as described in connection with FIG. 10.

In another aspect, the plurality of emulation nets may be organized into the plurality of groups with each group being allocated to one of the plurality of slots. The plurality of slots corresponds to the transceiver clock. Each of the emulation nets may be assigned to one of the groups based on a location of a cut of the emulation net. For example, referring to FIG. 10, each emulation net that is cut may be assigned to a group of partitioned nets based on like timing characteristics as determined by the location of the cut on the net.

In block 1106, the system is capable of assigning a first (e.g., one or more) timing constraint to a first portion of the net corresponding to a driver of the net to the cut. For example, the system is capable of assigning one or more timing constraints to the signal path from FF 1002 to the cut, whether cut 1, cut 2, or cut 3. In block 1108, the system is capable of assigning a second (e.g., one or more) timing constraint to a second portion of the net corresponding to the cut to a load of the net. For example, the system is capable of assigning one or more timing constraints to the signal path starting at the cut (e.g., cut 1, cut 2, or cut 3) to FF 1006.

Regardless of the cut, the first and second timing constraints are generated to depend on the slot to which the net is assigned. Assignment of timing constraints is described in connection with FIGS. 4 and 10.

In block 1110, the system is capable of implementing partitions of the circuit design including the net using the first and second timing constraints. The system, for example, is capable of performing synthesis, placement, and routing of the partitions for implementation in different ICs 106 of emulation system 100. Once a design flow has been performed using the timing constraints, the resulting configuration data may be loaded into the respective ICs 106 of emulation system 100 to emulate the circuit design.

In another aspect, method 1100 may include changing the slot of the net post implementation of the circuit design in emulation system 100. For example, the slot of the net may be exchanged or swapped with another slot to alleviate a timing violation of the net. In still another example implementation, method 1100 may include assigning the net to a slot by excluding one or more slots from consideration. In assigning the net to a slot, for example, slot 0 may be omitted from consideration by the system leaving only slots 2-7 for assigning the net.

Figure 12:
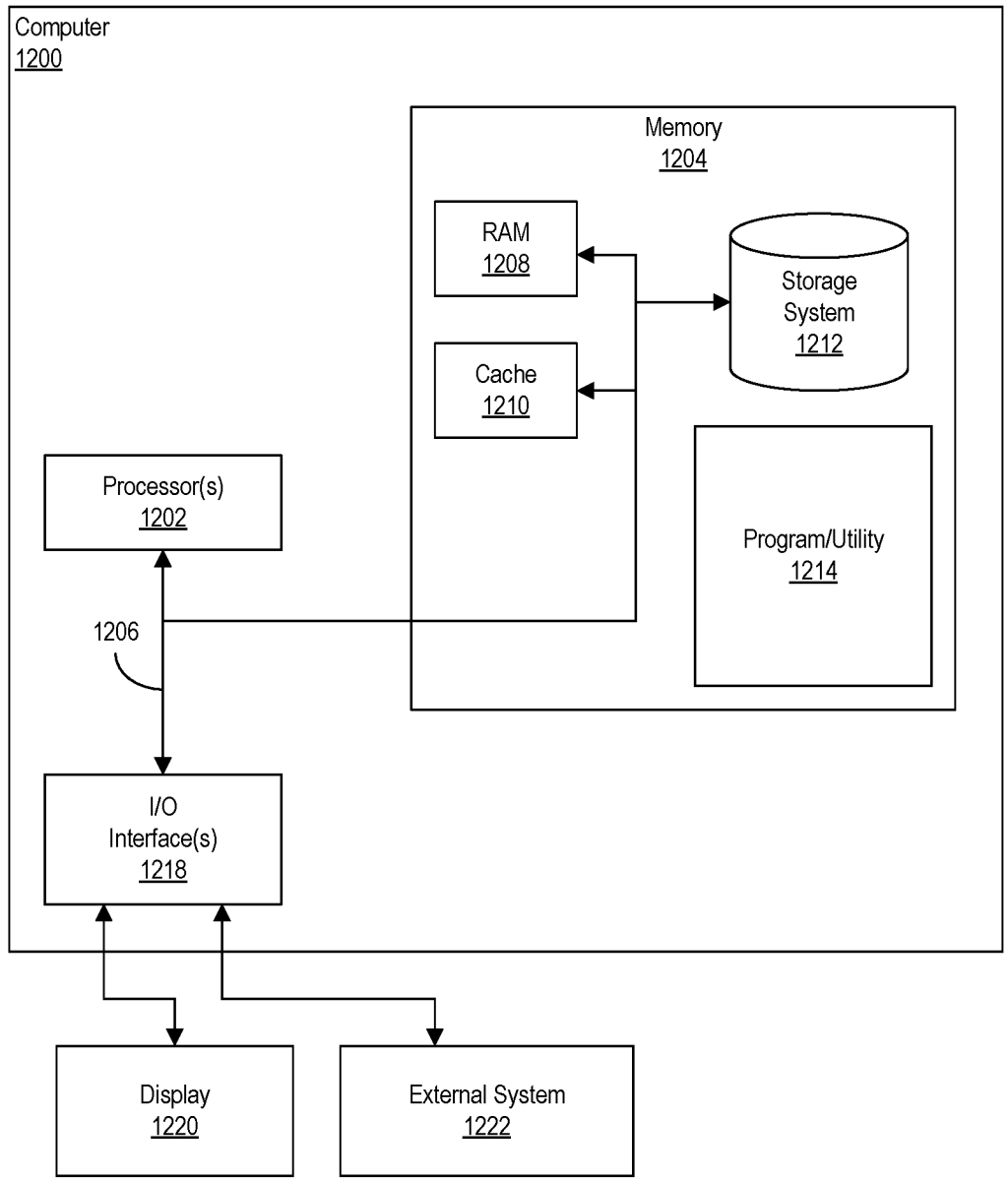
FIG. 12 illustrates an example computer for use with the inventive arrangements described herein.

FIG. 12 illustrates an example implementation of computer 1200. Computer 1200 can include a processor 1202, a memory 1204, and a bus 1206 that couples various system components including memory 1204 to processor 1202. Processor 1202 may be implemented as one or more processors. In an example, processor 1202 is implemented as a central processing unit (CPU). Example processor types include, but are not limited to, processors having an x86 type of architecture (IA-32, IA-64, etc.), Power Architecture, ARM processors, and the like.

Bus 1206 represents one or more of any of a variety of communication bus structures. By way of example, and not limitation, bus 1206 may be implemented as a Peripheral Component Interconnect Express (PCIe) bus. Computer 1200 typically includes a variety of computer system readable media. Such media may include computer-readable volatile and non-volatile media and computer-readable removable and non-removable media.

In the example of FIG. 12, computer 1200 includes memory 1204. Memory 1204 can include computer-readable media in the form of volatile memory, such as random-access memory (RAM) 1208 and/or cache memory 1210. Computer 1200 can also include other removable/non-removable, volatile/non-volatile computer storage media. By way of example, storage system 1212 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1206 by one or more data media interfaces. Memory 1204 and the various components illustrated in memory 1204 are examples of computer program products.

Program/utility 1214 may be stored in memory 1204. By way of example, program/utility may include program code corresponding to an operating system, one or more application programs, other executable instructions and/or scripts, and/or program data. Program/utility 1214, when executed by processor 1202, generally carries out the functions and/or methodologies of the example implementations described within this disclosure. Program/utility 1214 and any data items used, generated, and/or operated upon by computer 1200 are functional data structures that impart functionality when employed by computer 1200.

Computer 1200 may include one or more Input/Output (I/O) interfaces 1218 communicatively linked to bus 1206. I/O interface(s) 1218 allow computer 1200 to communicate with external devices, couple to external devices that allow user(s) to interact with computer 1200, couple to external devices that allow computer 1200 to communicate with other computing devices, and the like. For example, computer 1200 may be communicatively linked to a display 1220 and to external system 1222 through I/O interface(s) 1218. In an example, external system 1222 may be emulation system 100. Computer 1200 may be coupled to other external devices such as a keyboard (not shown) via I/O interface(s) 1218. Examples of I/O interfaces 1218 may include, but are not limited to, network cards, modems, network adapters, hardware controllers, etc.

Computer 1200 is an example of a data processing system and/or computer hardware that is capable of performing various operations described within this disclosure. Computer 1200 can be practiced as a standalone computer system such as a server, as part of a computer cluster (e.g., one or more interconnected or networked computers), or in distributed cloud computing environments where tasks are performed by remote processing devices that are linked through a communications network. In a distributed cloud computing environment, program modules may be located in both local and remote computer system storage media including memory storage devices. The example of FIG. 12 is not intended to suggest any limitation as to the scope of use or functionality of example implementations described herein.

Computer 1200 may include fewer components than shown or additional components not illustrated in FIG. 12 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

Computer 1200 is also an example implementation of one or more EDA tools including a partitioner. Program/utility 1214 may include program code that is capable of performing partitioning of a circuit design and a design flow (e.g., synthesis, placement, routing, and/or configuration data generation) on the partitioned circuit design as described herein. In this regard, computer 1200 serves as an example of one or more EDA tools or a system that is capable of processing circuit designs and/or generating configuration data that may be loaded into ICs 106 to emulate the circuit design in emulation system 100.

Figure 13:
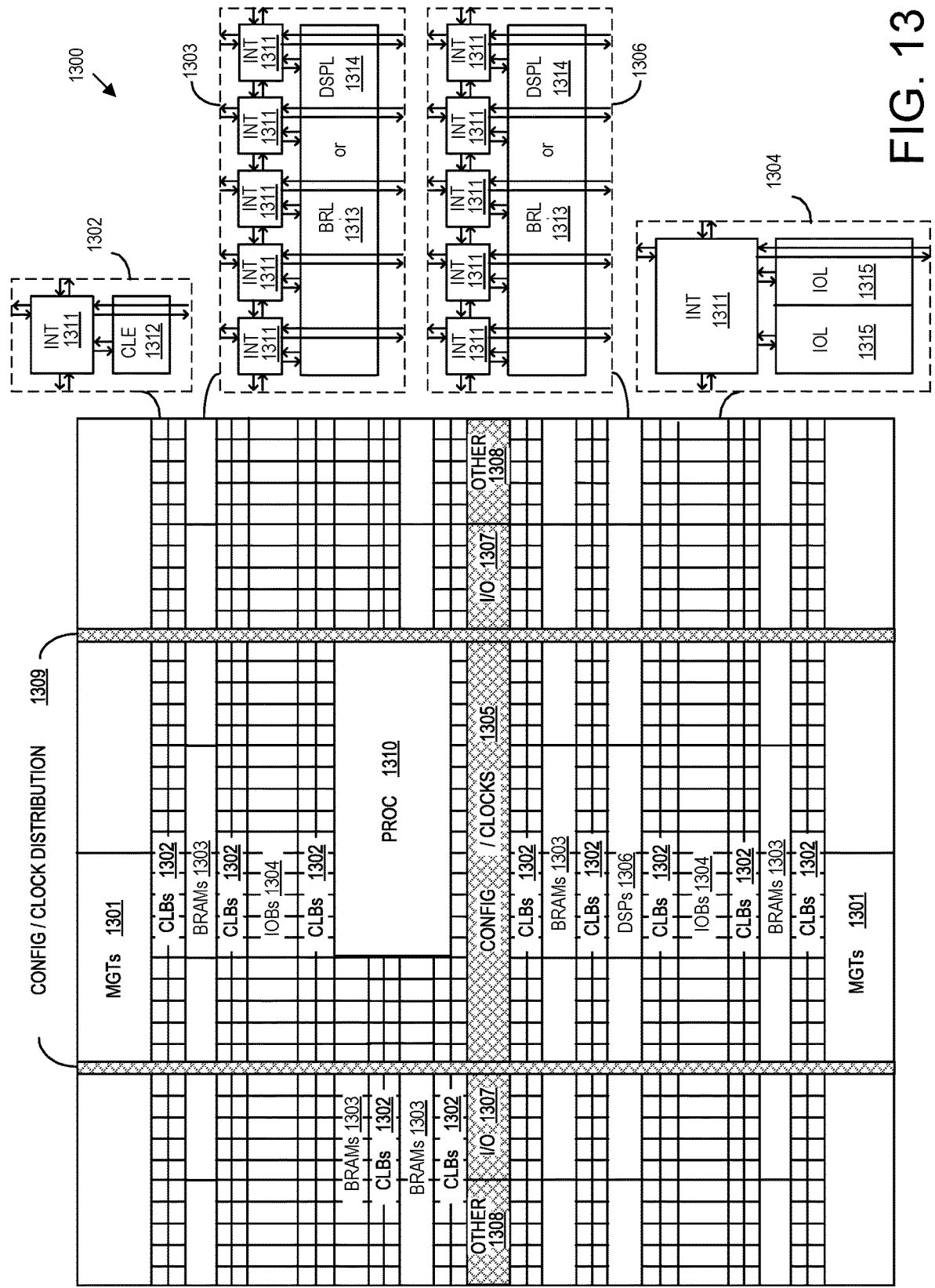
FIG. 13 illustrates an example architecture for an IC that may be used in the emulation system of FIG. 1.

FIG. 13 illustrates an example architecture 1300 for an IC. In one aspect, architecture 1300 may be implemented within a programmable IC. For example, architecture 1300 may be used to implement an FPGA. Architecture 1300 may also be representative of an SoC type of IC. An example of an SoC is an IC that includes a processor that executes program code and one or more other circuits. The other circuits may be implemented as hardwired circuitry, programmable circuitry, and/or a combination thereof. The circuits may operate cooperatively with one another and/or with the processor. Architecture 1300 or one similar thereto may be used to implement one or more or all of ICs 106 of emulation system 100.

As shown, architecture 1300 includes several different types of programmable circuit, e.g., logic, blocks. For example, architecture 1300 may include a large number of different programmable tiles including multi-gigabit transceivers (MGTs) 1301, configurable logic blocks (CLBs) 1302, random access memory blocks (BRAMs) 1303, input/output blocks (IOBs) 1304, configuration and clocking logic (CONFIG/CLOCKS) 1305, digital signal processing blocks (DSPs) 1306, specialized I/O blocks 1307 (e.g., configuration ports and clock ports), and other programmable logic 1308 such as digital clock managers, analog-to-digital converters, system monitoring logic, and so forth. In an example implementation, PHYs 206 may be implemented using MGTs 1301.

In some ICs, each programmable tile includes a programmable interconnect element (INT) 1311 having standardized connections to and from a corresponding INT 1311 in each adjacent tile. Therefore, INTs 1311, taken together, implement the programmable interconnect structure for the illustrated IC. Each INT 1311 also includes the connections to and from the programmable logic element within the same tile, as shown by the examples included at the right of FIG. 13.

For example, a CLB 1302 may include a configurable logic element (CLE) 1312 that may be programmed to implement user logic plus a single INT 1311. A BRAM 1303 may include a BRAM logic element (BRL) 1313 in addition to one or more INTs 1311. Typically, the number of INTs 1311 included in a tile depends on the height of the tile. As pictured, a BRAM tile has the same height as five CLBs, but other numbers (e.g., four) also may be used. A DSP tile 1306 may include a DSP logic element (DSPL) 1314 in addition to an appropriate number of INTs 1311. An IOB 1304 may include, for example, two instances of an I/O logic element (IOL) 1315 in addition to one instance of an INT 1311. The actual I/O pads connected to IOL 1315 may not be confined to the area of IOL 1315. In an example implementation, TX circuit 202 and RX circuit 204 may be implemented in programmable circuitry (e.g., programmable logic).

In the example pictured in FIG. 13, the area near the center of the die, e.g., formed of regions 1305, 1307, and 1308, may be used for configuration, clock, and other control logic. Other areas 1309 may be used to distribute the clocks and configuration signals across the breadth of the programmable IC.

Some ICs utilizing the architecture illustrated in FIG. 13 include additional logic blocks that disrupt the regular columnar structure making up a large part of the IC. The additional logic blocks may be programmable blocks and/or dedicated circuitry. For example, a processor block depicted as PROC 1310 spans several columns of CLBs and BRAMs.

In one aspect, PROC 1310 may be implemented as dedicated circuitry, e.g., as a hardwired processor, that is fabricated as part of the die that implements the programmable circuitry of the IC. PROC 1310 may represent any of a variety of different processor types and/or systems ranging in complexity from an individual processor, e.g., a single core capable of executing program code, to an entire processor system having one or more cores, peripherals, co-processors, interfaces, or the like.

In another aspect, PROC 1310 may be omitted from architecture 1300 and replaced with one or more of the other varieties of the programmable blocks described. Further, such blocks may be utilized to form a "soft processor" in that the various blocks of programmable circuitry may be used to form a processor that can execute program code as is the case with PROC 1310.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., a hardwired version of PROC 1310.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 1310 or a soft processor. In some cases, architecture 1300 includes a dedicated configuration processor that loads the configuration bitstream to the appropriate configuration memory and/or processor memory. The dedicated configuration processor does not execute user-specified program code. In other cases, architecture 1300 may utilize PROC 1310 to receive the configuration bitstream, load the configuration bitstream into appropriate configuration memory, and/or extract program code for execution.

FIG. 13 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the right of FIG. 13 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 1310 within the IC are for purposes of illustration only and are not intended as limitations.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Accordingly, an emulation system can include a first IC including first circuitry and a first transceiver. The first circuitry is configured to emulate a first partition of a circuit design. The first circuitry is clocked by an emulation clock and the first transceiver is clocked by a transceiver clock asynchronous with the emulation clock. The transceiver clock has a higher frequency than the emulation clock. The emulation system can include a second IC configured to emulate a second partition of the circuit design. The second IC includes a second transceiver. The first transceiver is configured to generate multiplexed emulation data by multiplexing a plurality of nets that cross from the first partition to the second partition of the circuit design. The first transceiver is configured to send the multiplexed emulation data over a serial communication channel to the second transceiver. The multiplexed emulation data includes a clock signal of the first transceiver embedded therein.

The foregoing and other implementations can each optionally include one or more of the following features, alone or in combination. Some example implementations include all the following features in combination.

In another aspect, the first transceiver includes a physical layer circuit configured to send the multiplexed emulation data over the serial communication channel using differential signaling. The plurality of nets belong to a same clock domain.

In another aspect, the plurality of nets are organized into a plurality of groups, wherein each group is allocated to one of a plurality of slots, the plurality of slots corresponding to the transceiver clock. Each net is assigned to one of the groups based on a location of a cut of the net.

In another aspect, the plurality of nets are organized into a plurality of groups, wherein each group is allocated to one of a plurality of slots, the plurality of slots corresponding to the transceiver clock. The first partition of the circuit design may be implemented in the first IC using timing constraints for the plurality of nets that depend on the slot to which each net is assigned.

In another aspect, the second partition of the circuit design is implemented in the second integrated circuit using timing constraints for the plurality of nets that depend on the slot to which each net is assigned.

In another aspect, the plurality of nets are organized into a plurality of groups, wherein each group is allocated to one of a plurality of slots corresponding to the transceiver clock. The circuit design may be partitioned into the first partition and the second partition by preventing any of the plurality of groups from being allocated to an earliest slot of the plurality of slots.

In another aspect, the plurality of nets are organized into a plurality of groups, wherein each group is allocated to one of a plurality of slots corresponding to the transceiver clock. Subsequent to implementation of the first partition of the circuit design within the first integrated circuit, at least one of the plurality of groups is re-allocated to a different slot.

In another aspect, the first transceiver includes a framing circuit block configured to generate packets of the multiplexed emulation data and generate an error-detection code that is included with each packet for sending to the second transceiver.

In another aspect, the packets are sent to the second transceiver using raw mode.

An IC can include first circuitry configured to emulate a partition of a circuit design. The first circuitry is clocked by an emulation clock. The IC includes a transceiver coupled to the first circuitry. The transceiver is clocked by a transceiver clock that is asynchronous with the emulation clock and that has a higher frequency than the emulation clock. The transceiver can include an edge detector circuit configured to detect edges of the emulation clock and a framing circuit configured to generate multiplexed emulation data by multiplexing a plurality of nets of the first circuitry. The framing circuit further generates packets of the multiplexed emulation data. The framing circuit is operative responsive to the edge detector circuit. The transceiver can include a scrambler circuit configured to scramble the packets from the framing circuit. The transceiver also can include a physical layer circuit (PHY) configured to send the scrambled packets over a serial communication channel. The scrambled packets include a clock signal of the transceiver embedded therein.

The foregoing and other implementations can each optionally include one or more of the following features, alone or in combination. Some example implementations include all the following features in combination.

In one aspect, the PHY is configured to send the multiplexed emulation data over the serial communication channel using differential signaling. The plurality of nets belong to a same clock domain.

In another aspect, the plurality of nets are organized into a plurality of groups, wherein each group is allocated to one of a plurality of slots corresponding to the transceiver clock.

The partition of the circuit design is implemented using timing constraints that depend on the slot to which each net is assigned.

In another aspect, the plurality of nets are organized into a plurality of groups, wherein each group is allocated to one of a plurality of slots corresponding to the transceiver clock. The circuit design is partitioned by preventing any of the plurality of groups from being allocated to an earliest slot of the plurality of slots.

In another aspect, the plurality of nets are organized into a plurality of groups, wherein each group is allocated to one of a plurality of slots corresponding to the transceiver clock. Subsequent to implementation of the partition of the circuit design, at least one of the plurality of groups are re-allocated to a different slot.

In another aspect, the framing circuit is configured to generate an error-detection code that is included with each packet for sending over the serial communication channel.

In another aspect, the packets are sent over the serial communication channel using raw mode.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, "data processing system" means one or more hardware systems configured to process data, each hardware system including at least one processor programmed to initiate operations and memory. An example of a data processing system is a computer or one or more interconnected or networked computers.

As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "processor" means at least one circuit capable of carrying out instructions contained in program code. The circuit may be an integrated circuit or embedded in an integrated circuit.

As defined herein, the term "output" means storing in physical memory elements, e.g., devices, writing to display or other peripheral output device, sending or transmitting to another system, exporting, or the like.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general-purpose computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

What is claimed is:

1. An emulation system, comprising:
    a first integrated circuit including first circuitry and a first transceiver, wherein the first circuitry is configured to emulate a first partition of a circuit design;
    wherein the first circuitry is clocked by an emulation clock and the first transceiver is clocked by a transceiver clock asynchronous with the emulation clock, the transceiver clock has a higher frequency than the emulation clock;
    a second integrated circuit configured to emulate a second partition of the circuit design, the second integrated circuit including a second transceiver;
    wherein the first transceiver is configured to generate multiplexed emulation data by multiplexing a plurality of nets that cross from the first partition to the second partition of the circuit design; and
    wherein the first transceiver is configured to send the multiplexed emulation data over a serial communication channel to the second transceiver, wherein the multiplexed emulation data includes a clock signal of the first transceiver embedded therein.

2. The emulation system of claim 1, wherein the first transceiver includes a physical layer circuit configured to send the multiplexed emulation data over the serial communication channel using differential signaling.

3. The emulation system of claim 1, wherein the plurality of nets belong to a same clock domain.

4. The emulation system of claim 1, wherein
    the plurality of nets are organized into a plurality of groups, wherein each group is allocated to one of a plurality of slots, the plurality of slots corresponding to the transceiver clock; and
    each net is assigned to one of the groups based on a location of a cut of the net.

5. The emulation system of claim 1, wherein
    the plurality of nets are organized into a plurality of groups, wherein each group is allocated to one of a plurality of slots, the plurality of slots corresponding to the transceiver clock; and the first partition of the circuit design is implemented in the first integrated circuit using timing constraints for the plurality of nets that depend on the slot to which each net is assigned.

6. The emulation system of claim 5, wherein
the second partition of the circuit design is implemented in the second integrated circuit using timing constraints for the plurality of nets that depend on the slot to which each net is assigned.

7. The emulation system of claim 1, wherein
the plurality of nets are organized into a plurality of groups, wherein each group is allocated to one of a plurality of slots corresponding to the transceiver clock; and
the circuit design is partitioned into the first partition and the second partition by preventing any of the plurality of groups from being allocated to an earliest slot of the plurality of slots.

8. The emulation system of claim 1, wherein
the plurality of nets are organized into a plurality of groups, wherein each group is allocated to one of a plurality of slots corresponding to the transceiver clock; and
subsequent to implementation of the first partition of the circuit design within the first integrated circuit, at least one of the plurality of groups is re-allocated to a different slot.

9. The emulation system of claim 1, wherein
the first transceiver includes a framing circuit block configured to generate packets of the multiplexed emulation data and generate an error-detection code that is included with each packet for sending to the second transceiver.

10. The emulation system of claim 9, wherein the packets are sent to the second transceiver using raw mode.

11. An integrated circuit, comprising:
first circuitry configured to emulate a partition of a circuit design, wherein the first circuitry is clocked by an emulation clock;
a transceiver coupled to the first circuitry, wherein the transceiver is clocked by a transceiver clock that is asynchronous with the emulation clock and has a higher frequency than the emulation clock, wherein the transceiver includes:
an edge detector circuit configured to detect edges of the emulation clock;
a framing circuit configured to generate multiplexed emulation data by multiplexing a plurality of nets of the first circuitry that cross to a different partition of the circuit design and generate packets of the multiplexed emulation data, wherein the framing circuit operates responsive to the edge detector circuit;
a scrambler circuit configured to scramble the packets from the framing circuit; and
a physical layer circuit configured to send the scrambled packets over a serial communication channel, wherein the scrambled packets include a clock signal of the transceiver embedded therein.

12. The integrated circuit of claim 11, wherein the physical layer circuit is configured to send the multiplexed emulation data over the serial communication channel using differential signaling.

13. The integrated circuit of claim 11, wherein
the plurality of nets belong to a same clock domain.

14. The integrated circuit of claim 11, wherein
the plurality of nets are organized into a plurality of groups, wherein each group is allocated to one of a plurality of slots corresponding to the transceiver clock; and
the partition of the circuit design is implemented using timing constraints that depend on the slot to which each net is assigned.

15. The integrated circuit of claim 11, wherein
the plurality of nets are organized into a plurality of groups, wherein each group is allocated to one of a plurality of slots corresponding to the transceiver clock; and
the circuit design is partitioned by preventing any of the plurality of groups from being allocated to an earliest slot of the plurality of slots.

16. The integrated circuit of claim 11, wherein
the plurality of nets are organized into a plurality of groups, wherein each group is allocated to one of a plurality of slots corresponding to the transceiver clock; and
subsequent to implementation of the partition of the circuit design, at least one of the plurality of groups are re-allocated to a different slot.

17. The integrated circuit of claim 11, wherein
the framing circuit is configured to generate an error-detection code that is included with each packet for sending over the serial communication channel.

18. The integrated circuit of claim 11, wherein the packets are sent over the serial communication channel using raw mode.

19. A method, comprising:
determining a cut of a net of a circuit design, wherein the net is cut as part of a partitioning process to emulate the circuit design using an emulation system;
assigning the net to a selected slot selected from a plurality of slots of a transceiver in an integrated circuit of the emulation system, wherein the selected slot is selected based on a location of the cut along the net;
assigning a first timing constraint to a first portion of the net, wherein the first timing constraint imposes a first timing penalty and corresponds to a driver of the net to the cut;
assigning a second timing constraint to a second portion of the net, wherein the second timing constraint imposes a second timing penalty and corresponds to the cut to a load of the net;
wherein the first timing constraint and the second timing constraint both vary with a distance in time between the selected slot and an emulation clock cycle on which emulation data for the net is received; and
implementing partitions of the circuit design including the net using the first and second timing constraints.

20. The method of claim 19, wherein:
the first timing penalty increases as the distance in time between the selected slot and the emulation clock cycle decreases; and
the second timing penalty decreases as the distance in time between the selected slot and the emulation clock cycle increases.

* * * * *